(12) United States Patent
Liu et al.

(10) Patent No.: US 8,450,154 B2
(45) Date of Patent: May 28, 2013

(54) OXIDE BASED MEMORY WITH A CONTROLLED OXYGEN VACANCY CONDUCTION PATH

(75) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 13/087,050

(22) Filed: Apr. 14, 2011

(65) Prior Publication Data
US 2012/0261637 A1  Oct. 18, 2012

(51) Int. Cl.
*H01L 21/82* (2006.01)

(52) U.S. Cl.
USPC ......... 438/128; 438/598; 257/4; 257/E21.613

(58) Field of Classification Search
USPC .............. 438/90, 590; 257/E21.536, E21.613
See application file for complete search history.

(56) References Cited

U.S. PATENT DOCUMENTS

| 7,560,721 | B1 | 7/2009 | Breitwisch et al. |
| 7,639,523 | B2 | 12/2009 | Celinska et al. |
| 7,795,606 | B2 | 9/2010 | Jin et al. |
| 2009/0298253 | A1 | 12/2009 | Rossel et al. |
| 2011/0095259 | A1* | 4/2011 | Lee ................................... 257/4 |

* cited by examiner

*Primary Examiner* — Cheung Lee
(74) *Attorney, Agent, or Firm* — Brooks, Cameron & Huebsch, PLLC

(57) ABSTRACT

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

31 Claims, 5 Drawing Sheets

OXIDE BASED MEMORY WITH A CONTROLLED OXYGEN VACANCY CONDUCTION PATH

TECHNICAL FIELD

The present disclosure relates generally to semiconductor memory devices and methods, and more particularly, to oxide based memory with a controlled oxygen vacancy conduction path.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix, e.g., array. For example, an access device, such as a diode, a field effect transistor (FET), or bipolar junction transistor (BJT), for a memory cell may be coupled to an access line, e.g., word line, forming a "row" of the array. Each memory cell may be coupled to a data line, e.g., bit line, in a "column" of the array. In this manner, the access device of a memory cell may be accessed through a row decoder activating a row of memory cells by selecting the word line coupled to their gates. The programmed state of a selected memory cell may be determined, e.g., sensed, by causing different currents, to flow in the memory cell depending on the resistance associated with a programmed state for a particular memory cell.

Memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Resistive memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Oxide based memory devices such as RRAM may store data by varying the resistance level of a resistive memory element. Data may be programmed to a selected RRAM cell by applying sources of energy, such as positive or negative electrical pulses, e.g., positive or negative voltage or current pulses, to a particular resistive memory element for a predetermined duration. RRAM cells may be programmed to a number of resistance levels by application of voltages or currents of various magnitudes, polarities, and durations.

With some oxide based memory devices, e.g., RRAM, an electroforming process may be used to form a high oxygen vacancy concentration filament between electrodes, e.g., a virtual cathode and an active anode, to facilitate subsequent switching by oxygen vacancy under the influence of an externally applied electrical field. However, due to the roughness and large size of the electrodes, the electroformed oxygen vacancy conduction path may initiate at random sites, the path may be distorted by defect sites in the oxide material, and/or multiple filaments may be formed, which may lead to device-to-device variation.

DETAILED DESCRIPTION

Figure 1:
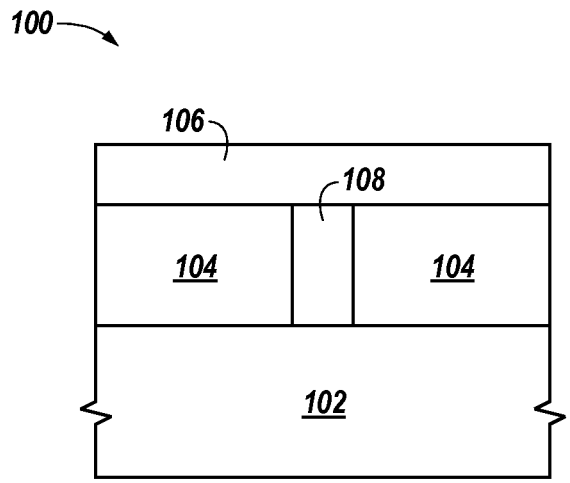
FIG. 1 illustrates a cross-sectional view of a portion of an oxide based memory cell in accordance with one or more embodiments of the present disclosure.

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 202 may reference element "02" in FIG. 2C, and a similar element may be referenced as 402 in FIG. 4C. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates a cross-sectional view of a portion of an oxide based memory cell 100 in accordance with one or more embodiments of the present disclosure. The oxide based memory cell can include a first conductive element 102, e.g., a bottom electrode and/or cathode. An oxide 104, e.g., a valence change oxide, can be formed over the first conductive element 102. According to one or more embodiments of the present disclosure, the valence change oxide 104 can include a controlled oxygen vacancy conduction path 108 defined near a center of the valence change oxide 104. A second conductive element 106 can be fowled over the valence change oxide 104 and over the controlled oxygen vacancy conduction path 108.

Controlled oxygen vacancy conduction path 108 definition can provide for a conduction path in an oxide based memory cell 100 without electroforming. Electroforming can include applying a high voltage, e.g., larger than would be used to cause switching, across a memory cell to generate a filamentary conduction path between electrodes. Subsequent switching of the memory cell, e.g., between resistance states, is facilitated by the conduction path. However, as described herein, the electroformed oxygen vacancy conduction path may initiate at random sites, the path may be distorted by defect sites in the oxide material, and/or multiple filaments may be formed, which may lead to device-to-device variation. Thus, according to the present disclosure, an oxide based memory cell 100 can be provided with a predefined controlled oxygen vacancy conduction path 108 to avoid the disadvantages associated with the electroforming process. Furthermore, the high voltages associated with the electroforming process can lead to an irreversible state, e.g., conduction path, between the electrodes, or damage to the oxide. Thus, for example, one or more embodiments of the present disclosure can promote more consistent and controllable switching. For example, as used herein a "controlled" oxygen vacancy conduction path can include a conduction path that is defined by the formation of the memory cell 100 such that a location of the conduction path is predetermined and/or singular.

According to one or more embodiments of the present disclosure, the controlled oxygen vacancy conduction path 108 can be predefined by the memory cell 100 material, geometry, and/or process conditions, as described herein. Due to the predefined oxygen vacancy distribution provided by the present disclosure, it is likely that only one conduction path will participate in memory cell 100 switching to improve switching uniformity.

Figure 2A:
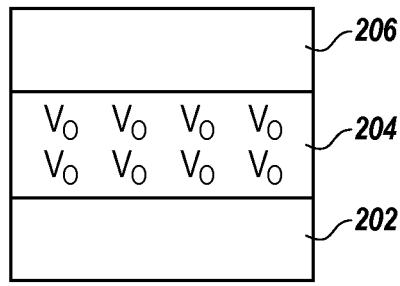
FIGS. 2A-2C illustrate cross-sectional views of process stages associated with forming a portion of an oxide based memory cell in accordance with one or more embodiments of the present disclosure.
Figure 2B:
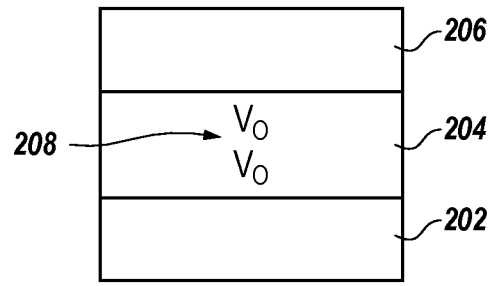
Figure 2C:
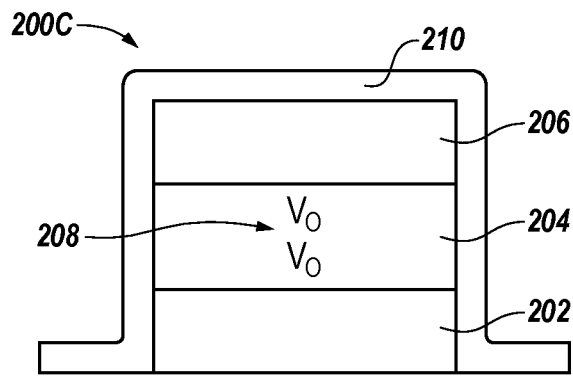

FIGS. 2A-2C illustrate cross-sectional views of process stages associated with forming a portion of an oxide based memory cell in accordance with one or more embodiments of the present disclosure. FIG. 2A illustrates a portion of an oxide based memory cell 200A at a particular process stage. A first conductive element 202, e.g., a cathode, can be formed over a substrate, for example. An oxide 204, e.g., a substoichiometric oxide, can be formed over the first conductive element 202. A substoichiometric oxide can be an oxide that has an oxygen percentage below a stoichiometric ratio for the oxide. A near-stoichiometric oxide can be an oxide that has an oxygen percentage at or approximately at a stoichiometric ratio for the oxide. Examples of oxides 204 include titanium oxide (TiOx), copper oxide (CuOx), and tantalum oxide (TaOx), among others. As illustrated in FIG. 2A, the oxide 204 includes many oxygen vacancies ("Vo"). A second conductive element 206, e.g., an anode, can be formed over the oxide 204. The first conductive element 202 and the second conductive element 206 can be electrodes between which a conductive pathway can be formed through the oxide 204.

FIG. 2B illustrates a portion of an oxide based memory cell 200B, e.g., analogous to the oxide based memory cell 200A illustrated in FIG. 2A, at a subsequent process stage. For example, the edges of the substoichiometric oxide 204 of the memory cell 200A can be oxidized by subjecting the memory cell 200A to an oxidizing environment to define a controlled oxygen vacancy conduction path 208 near a center of the oxide 204, as illustrated for the memory cell 200B in FIG. 2B. The oxidizing environment can oxidize, e.g., fill oxygen vacancies, at the edges of the substoichiometric oxide 204, leaving oxygen vacancies near a center of the oxide 204, which can serve as a controlled oxygen vacancy conduction path 208. The oxidizing environment can include one or more of oxygen and ozone, for instance. Oxidizing the edges of the substoichiometric oxide 204 can include exposing, e.g., thermally annealing, the substoichiometric oxide 204 to, e.g., in, the oxidizing environment. Some embodiments can include the use of oxygen plasma, e.g., plasma ion implantation, for oxidizing the edges of the substoichiometric oxide 204. One or more embodiments can include a wet oxidation process for oxidizing the edges of the substoichiometric oxide 204. In some embodiments, an oxygen vacancy gradient, e.g., a gradient such that greater oxygen vacancies exist near a center of the oxide 204 and fewer oxygen vacancies exist near the edges of the oxide 204, can be created across the substoichiometric oxide 204.

FIG. 2C illustrates a portion of an oxide based memory cell 200C, e.g., analogous to the oxide based memory cell 200A illustrated in FIG. 2A, at a subsequent process stage. The processing stage illustrated in FIG. 2C can be subsequent to the stage illustrated in FIG. 2A, e.g., without going through the stage illustrated in FIG. 2B, or subsequent to the stage illustrated in FIG. 2B, e.g., after subjecting the substoichiometric oxide 204 to an oxidizing environment. The portion of the memory cell 200C, e.g., the first conductive element 202, the oxide 204, and the second conductive element 206, has been encapsulated with an oxygen-rich oxide 210. Oxygen in the oxygen-rich oxide 210 can diffuse into the substoichiometric oxide 204 to define, or further define, the controlled oxygen vacancy conduction path 208 near a center of the oxide 204. For example, oxygen can diffuse into the substoichiometric oxide 204 from the edges to fill the vacancies ("Vo") near the edges, leaving oxygen vacancies near a center of the oxide 204, which can serve as the controlled oxygen vacancy conduction path 208.

Figure 3A:
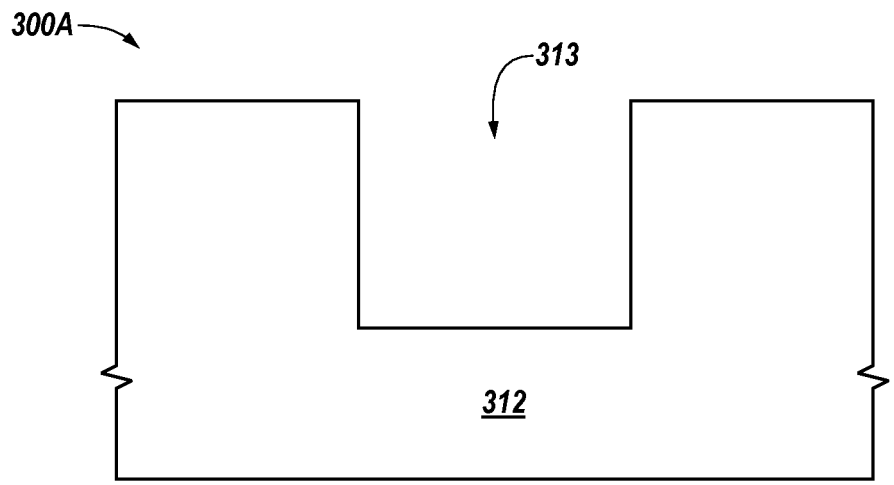
FIGS. 3A-3D illustrate cross-sectional views of process stages associated with forming a portion of an oxide based memory cell in accordance with one or more embodiments of the present disclosure.

FIGS. 3A-3D illustrate cross-sectional views of process stages associated with forming a portion of an oxide based memory cell in accordance with one or more embodiments of the present disclosure. FIG. 3A illustrates a portion of an oxide based memory cell 300A at a particular process stage. A via 313 can be formed in a dielectric 312. The via can be formed by a process such as etching, among others.

Figure 3B:
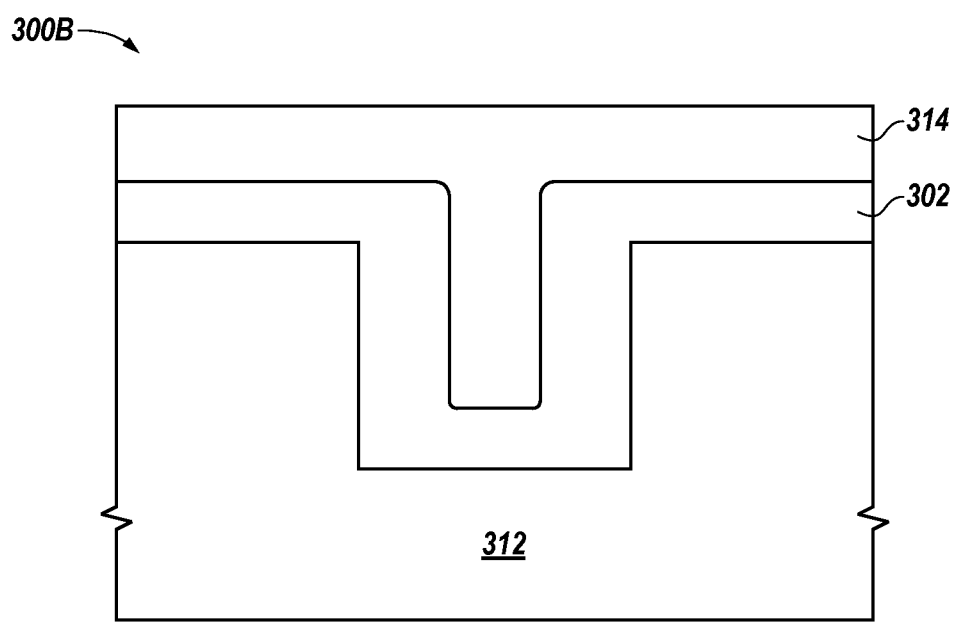

FIG. 3B illustrates a portion of an oxide based memory cell 300B, e.g., analogous to the oxide based memory cell 300A illustrated in FIG. 3A, at a subsequent process stage. A first conductive element 302 can be formed in the via 313. In some embodiments, the first conductive element 302 can be conformally deposited in the via 313 and on the dielectric 312. An oxygen getter material 314 can be formed over the first conductive element 302. An oxygen getter material can be a material that readily absorbs oxygen, e.g., oxygen from another material. In one or more embodiments the oxygen getter material 314 can be formed by deposition, e.g., conformal deposition on the first conductive element 302, including portions of the first conductive element 302 in the via 313. The oxygen getter material 314 can be a conductive oxygen getter material such as titanium or tantalum, among others. In general, an oxygen getter is a material with an affinity for attracting oxygen ions. Thus, as illustrated in FIG. 3B, the via 313 illustrated in FIG. 3A can be filled with a first conductive element 302 and an oxygen getter material 314.

Figure 3C:
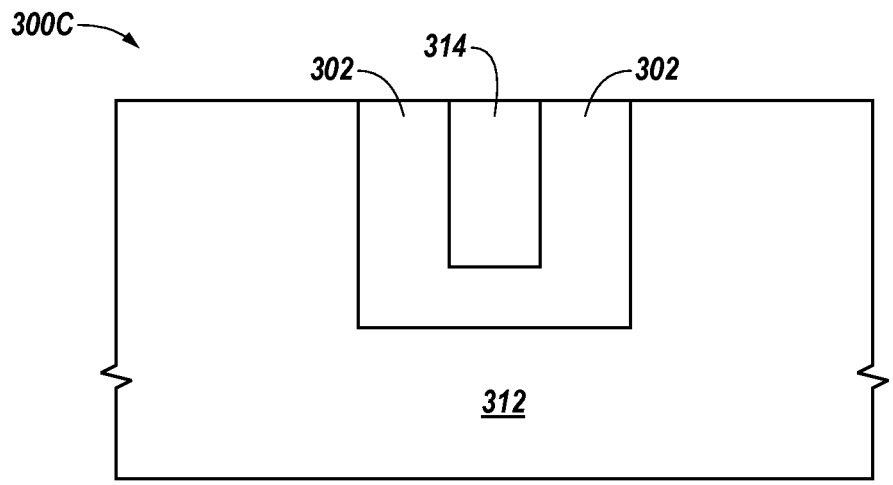
Figure 3D:
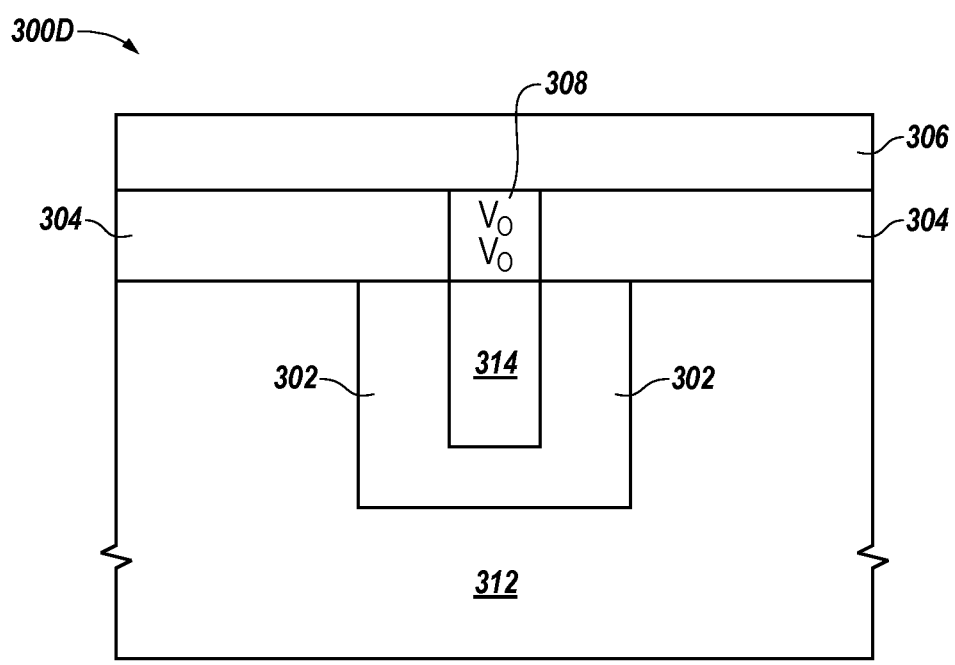

FIG. 3C illustrates a portion of an oxide based memory cell 300C, e.g., analogous to the oxide based memory cell 300A illustrated in FIG. 3A, at a subsequent process stage. Portions of the first conductive element 302 and the oxygen getter material 314 external to the via 313 can be removed, e.g., prior to forming an oxide as illustrated in FIG. 3D. For example, chemical-mechanical polishing (CMP) can be used to planarize the portion of the memory cell 300C. In some embodiments, the removal process can include removing portions of the dielectric 312. In one or more embodiments, the oxygen getter material 314 can form a self-aligned, e.g., formed without the use of patterning, sub-lithography feature of the portion of the memory cell 300C.

FIG. 3D illustrates a portion of an oxide based memory cell 300D, e.g., analogous to the oxide based memory cell 300A illustrated in FIG. 3A, at a subsequent process stage. An oxide 304 can be formed on the first conductive element 302 and on the oxygen getter material 314. Forming the oxide 304 can include defining a controlled oxygen vacancy conduction path 308 in the oxide 304, e.g., over the oxygen getter material 314. A second conductive element 306 can be formed on the oxide 304. The controlled oxygen vacancy conduction path 308 can be defined between the first conductive material 302 and the second conductive material 306.

In one or more embodiments, the first conductive element 302 can be an inert conductive element and the oxide 304 can be a near-stoichiometric oxide. In such embodiments, the oxygen getter material 314 can extract oxygen from the overlying oxide 304 to form a controlled oxygen vacancy conduction path 308 therein. In some embodiments the first conductive element 302 can be an oxygen-rich conductive element, e.g., a ruthenium oxide (RuOx), and the oxide 304 can be a substoichiometric oxide. In such embodiments, the oxygen-rich first conductive element 302 can provide oxygen to remove vacancies in the overlying substoichiometric oxide 304 leaving a controlled oxygen vacancy conduction path 308 near a center of the oxide 304.

Figure 4A:
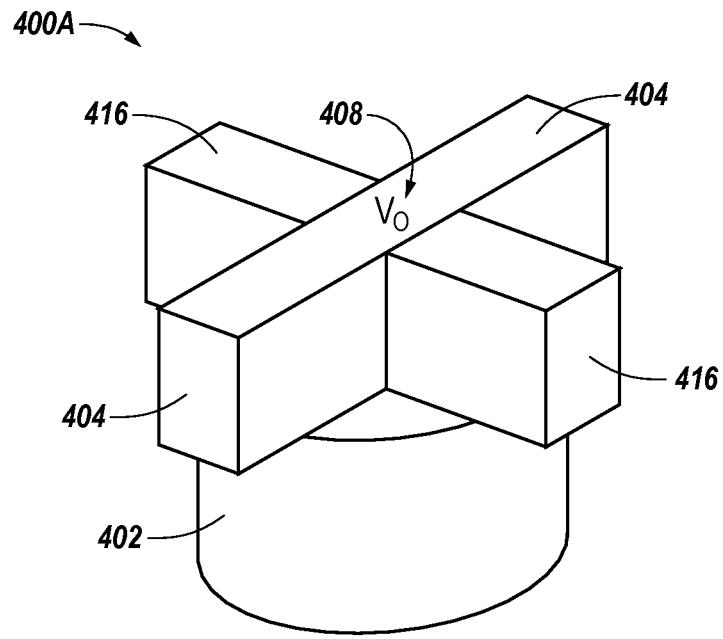
FIG. 4A illustrates a perspective view of a portion of an oxide based memory cell in accordance with one or more embodiments of the present disclosure.

FIG. 4A illustrates a perspective view of a portion of an oxide based memory cell 400A in accordance with one or more embodiments of the present disclosure. A first conductive element 402 can be formed. In some embodiments, the first conductive element 402 can be formed as a pillar. A substoichiometric oxide 404 can be patterned, e.g., in a strip of material, on the first conductive element 402. A first material 416 can be patterned, e.g., in a strip of material, on the first conductive element 402 perpendicular to and intersecting the substoichiometric oxide 404. Gaps between the substoichiometric oxide 404 and the first material 416, e.g., over the first conductive element 402, can be filled with a second material (not specifically illustrated in FIG. 4A, but shown at 410 in FIG. 4D) to define a controlled oxygen vacancy conduction path 408 in the oxide 404. A second conductive element (not specifically illustrated in FIG. 4A, but shown at 406 in FIGS. 4C and 4D) can be formed on the intersection of the substoichiometric oxide 404 and the first material 416. In some embodiments, the second conductive element can also be formed on other portions of the portion of the memory cell 400A, e.g., other portions of the substoichiometric oxide 404 and/or the first material 416. Examples of materials for the substoichiometric oxide 404 include a titanium oxide (TiOx), a copper oxide (CuOx), and a tantalum oxide (TaOx), among others.

In one or more embodiments, the first material 416 can be an oxygen block material and the second material can be an oxygen rich oxide. An oxygen block material can be a material that prevents oxygen from diffusing into another material and/or a material that readily absorbs oxygen. An oxygen rich oxide can be an oxide that can readily provide oxygen, e.g., to another material. In such embodiments, the oxygen rich oxide can provide oxygen to diffuse into the substoichiometric oxide 404, except in the portion of the substoichiometric oxide 404 blocked by the oxygen block material 416 thereby defining a controlled oxygen vacancy conduction path 408 near a center of the oxide 404, e.g., at intersections of the substoichiometric oxide 404 and the oxygen block material 416. In some embodiments, the first material 416 can be an oxygen getter material, the oxide 404 can be stoichiometric, and the second material can be a dielectric that is inert and therefore does not provide oxygen to oxidize the stoichiometric oxide 404. In such embodiments, the oxygen getter material helps to extract oxygen at the intersection of the first material 416 with the stoichiometric oxide 404 to define a controlled oxygen vacancy conduction path 408 near a center of the oxide 404, e.g., at intersections of the stoichiometric oxide 404 and the oxygen getter material 416.

Figure 4B:
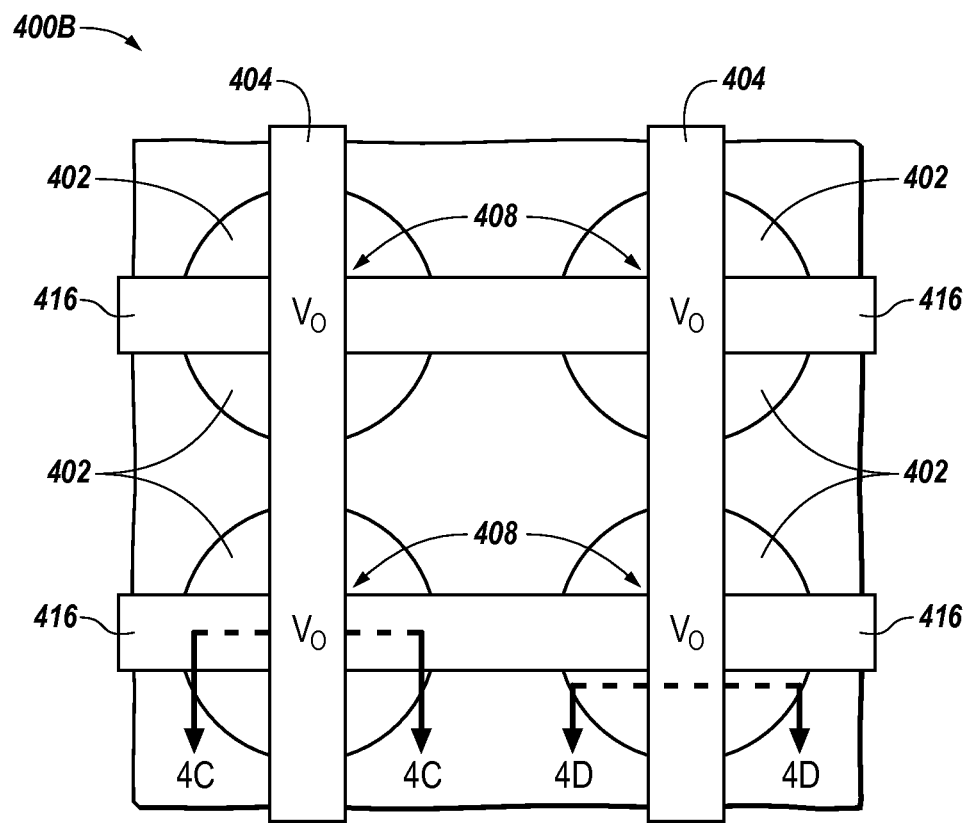
FIG. 4B illustrates a top-down view of a portion of an array of portions of oxide based memory cells.

FIG. 4B illustrates a top-down view of a portion of an array 401 of portions of oxide based memory cells 400B. Each of the portions of oxide based memory cells 400B can be analogous to the portion of the oxide based memory cell 400A illustrated in FIG. 4A. The portion of the array 401 illustrates how a number of portions of memory cells 400B can be arranged in an array where the substoichiometric oxide 404 extend across portions of multiple memory cells 400B as do the first material 416. The size of the array is not limited to the depiction illustrated in FIG. 4B as the array can include more or fewer memory cells 400B.

At least a portion of an array 401 of first conductive elements 402 can be formed. A substoichiometric oxide 404 can be formed on the portion of the array 401 of first conductive elements 402. A first material 416 can be patterned on the portion of the array of first conductive elements 402 perpendicular to and intersecting the substoichiometric oxide 404. As illustrated in FIG. 4B, the substoichiometric oxide 404 can be continuous, while the first material 416 can be discontinuous at the intersections with the first conductive element 404. A gap between the substoichiometric oxide 404 and the first material 416 can be filled with a second material to define a controlled oxygen vacancy conduction path 408 in the oxide 404 as described herein. For example, the controlled oxygen vacancy conduction path 408 can be defined at intersections of the substoichiometric oxide 404 and the first material 416 near a center of the first conductive element 402 for each memory cell 400B. At least a portion of an array of second conductive elements can be formed at least on the intersections of the substoichiometric oxide 404 and the first material 416.

Figure 4C:
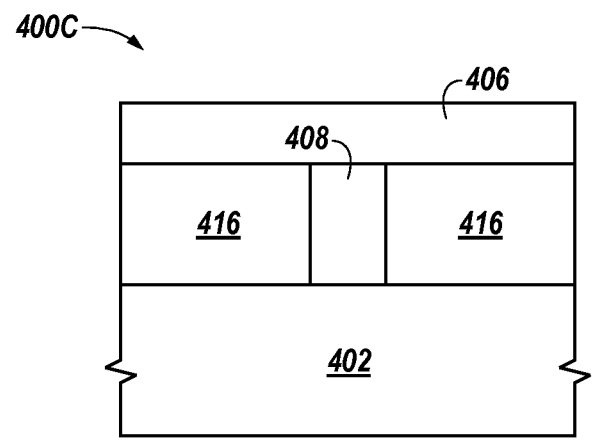
FIG. 4C illustrates a cross-sectional view of a portion of an oxide based memory cell illustrated in FIG. 4B taken along cut line 4C-4C.

FIG. 4C illustrates a cross-sectional view of a portion of an oxide based memory cell 400B illustrated in FIG. 4B taken along cut line 4C-4C. The portion of the memory cell 400C includes the first conductive element 402 underlying the discontinuous first material 416, separated by the controlled oxygen vacancy conduction path 408 near the center of the substoichiometric oxide 404. FIG. 4C also illustrates the second conductive element 406 formed over the controlled oxygen vacancy conduction path 408 in the oxide 404 and over the first material 416.

Figure 4D:
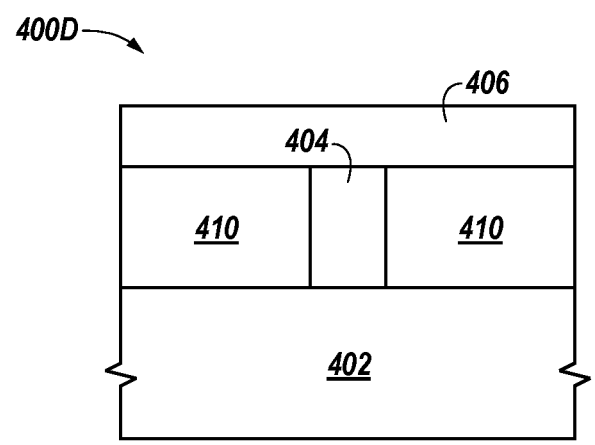
FIG. 4D illustrates a cross-sectional view of a portion of an oxide based memory cell illustrated in FIG. 4B taken along cut line 4D-4D.

FIG. 4D illustrates a cross-sectional view of a portion of an oxide based memory cell 400B illustrated in FIG. 4B taken along cut line 4D-4D. The portion of the memory cell 400D includes the first conductive element 402 underlying a portion of the substoichiometric oxide 404 and underlying portions of the second material 410, which can fill the gaps between the substoichiometric oxide 404 and the first material 416 as described herein. FIG. 4D also illustrates the second conductive element 406 formed over the portion of the substoichiometric oxide 404 and the portions of the second material 410.

Methods, devices, and systems associated with oxide based memory can include a method of forming an oxide based memory cell. Forming an oxide based memory cell can include forming a first conductive element, forming a substoichiometric oxide over the first conductive element, forming a second conductive element over the substoichiometric oxide, and oxidizing edges of the substoichiometric oxide by subjecting the substoichiometric oxide to an oxidizing environment to define a controlled oxygen vacancy conduction path near a center of the oxide.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming an oxide based memory cell, comprising:
    forming a first conductive element;
    forming a substoichiometric oxide over the first conductive element;
    forming a second conductive element over the substoichiometric oxide; and
    oxidizing edges of the substoichiometric oxide by subjecting the substoichiometric oxide to an oxidizing environment to define a controlled oxygen vacancy conduction path near a center of the oxide.

2. The method of claim 1, wherein oxidizing the edges of the substoichiometric oxide comprises creating an oxygen vacancy gradient across the substoichiometric oxide.

3. The method of claim 1, wherein oxidizing the edges of the substoichiometric oxide comprises encapsulating the first conductive element, the substoichiometric oxide, and the second conductive element with an oxygen-rich oxide.

4. The method of claim 1, wherein forming the substoichiometric oxide comprises forming an oxide having an oxygen percentage below a stoichiometric ratio for the oxide.

5. The method of claim 1, wherein oxidizing the edges of the substoichiometric oxide includes exposing the substoichiometric oxide to the oxidizing environment.

6. A method of forming an oxide based memory cell, comprising:
    forming a via in a dielectric;
    forming a first conductive element in the via;
    forming an oxygen getter over the first conductive element;
    forming an oxide over the first conductive element and over the oxygen getter, wherein forming the oxide over the oxygen getter includes defining a controlled oxygen vacancy conduction path; and
    forming a second conductive element over the oxide.

7. The method of claim 6, wherein:
    forming the first conductive element comprises forming an inert first conductive element; and
    forming the oxide comprises forming a near-stoichiometric oxide.

8. The method of claim 6, wherein:
    forming the first conductive element comprises forming an oxygen-rich first conductive element; and
    forming the oxide comprises forming a substoichiometric oxide.

9. The method of claim 6, wherein:
    forming the first conductive element comprises conformally depositing the first conductive element over the dielectric, including in the via; and
    forming the oxygen getter includes conformally depositing the oxygen getter over the first conductive element, including portions of the first conductive element in the via.

10. The method of claim 9, wherein the method includes removing portions of the first conductive element and the oxygen getter material that are external to the via prior to forming the oxide.

11. The method of claim 6, wherein the oxygen getter comprises one of titanium and tantalum.

12. The method of claim 6, wherein forming the oxygen getter includes forming a self-aligned sub-lithography conductive oxygen getter.

13. The method of claim 12, wherein forming the oxygen getter includes defining the controlled oxygen vacancy conduction path between the first conductive material and the second conductive material.

14. A method of forming an oxide based memory cell, comprising:
    forming an array of first conductive elements;
    patterning stripes of an oxide over the array of first conductive elements;
    patterning stripes of a first material over the array of first conductive elements perpendicular to and intersecting the stripes of the oxide;
    filling a gap between the stripes of the oxide and the stripes of the first material with a second material to define a controlled oxygen vacancy conduction path in the oxide; and
    forming an array of second conductive elements over intersections of the stripes of the oxide and the stripes of the first material.

15. The method of claim 14, wherein:
the first material comprises an oxygen block material;
the oxide comprises a substoichiometric oxide; and
the second material comprises an oxygen rich oxide.

16. The method of claim 15, wherein filling the gap between the stripes of the substoichiometric oxide and the stripes of the oxygen block material with the oxygen rich oxide includes defining the controlled oxygen vacancy conduction path in the substoichiometric oxide at the intersections of the stripes of the substoichiometric oxide and the stripes of the oxygen block material.

17. The method of claim 14, wherein:
the first material comprises an oxygen getter material;
the oxide comprises a stoichiometric oxide; and
the second material comprises an inert dielectric.

18. The method of claim 17, wherein filling the gap between the stripes of the stoichiometric oxide and the stripes of the oxygen getter material includes defining the controlled oxygen vacancy conduction path in the stoichiometric oxide at intersections of the stripes of the stoichiometric oxide and the stripes of the oxygen getter material.

19. The method of claim 14, wherein the method includes defining the controlled oxygen vacancy conduction path in the oxide at the intersections of the stripes of the oxide and the stripes of the first material.

20. An oxide based memory cell, comprising:
a first conductive element;
a substoichiometric oxide on the first conductive element;
a second conductive element on the substoichiometric oxide including a controlled oxygen vacancy conduction path at a center of the second conductive element; and
an oxygen-rich oxide encapsulating the first conductive element, the substoichiometric oxide, and the second conductive element.

21. The memory cell of claim 20, wherein the substoichiometric oxide comprises one of a titanium oxide (TiOx), a copper oxide (CuOx), and a tantalum oxide (TaOx).

22. An oxide based memory cell, comprising:
a first conductive element on a top surface and a side surface of a dielectric;
an oxygen getter on a top surface and a side surface of the first conductive element;
an oxide on the first conductive element and on the oxygen getter; and
a second conductive material on the oxide, wherein the oxygen getter defines a controlled oxygen vacancy conduction path between the first conductive element and the second conductive element.

23. The memory cell of claim 22, wherein the first conductive element is inert and the oxide is a near-stoichiometric oxide.

24. The memory cell of claim 22, wherein the first conductive element is oxygen-rich and the oxide is a substoichiometric oxide.

25. The memory cell of claim 24, wherein the oxygen-rich first conductive element comprises a ruthenium oxide (RuOx).

26. The memory cell of claim 22, wherein the oxygen getter comprises one of titanium and tantalum.

27. The memory cell of claim 22, wherein the oxygen getter comprises a self-aligned sub-lithography conductive oxygen getter.

28. An oxide based memory cell, comprising:
a first conductive element;
a substoichiometric oxide on the first conductive element;
a first material on the first conductive element perpendicular to and intersecting the substoichiometric oxide;
a second material between the substoichiometric oxide and the first material; and
a second conductive element on an intersection of the substoichiometric oxide and the first material,
wherein a controlled oxygen vacancy conduction path is defined in the substoichiometric oxide at the intersection of the substoichiometric oxide and the second material.

29. The memory cell of claim 28, wherein:
the first material comprises an oxygen block material; and
the second material comprises an oxygen rich oxide.

30. The memory cell of claim 28, wherein:
the first material comprises an oxygen getter material; and
the second material comprises an inert dielectric.

31. The memory cell of claim 28, wherein the substoichiometric oxide comprises one of a titanium oxide (TiOx), a copper oxide (CuOx), and a tantalum oxide (TaOx).

* * * * *